(12) United States Patent
Haase

(10) Patent No.: US 6,974,750 B2
(45) Date of Patent: Dec. 13, 2005

(54) PROCESS FOR FORMING A TRENCH POWER MOS DEVICE SUITABLE FOR LARGE DIAMETER WAFERS

(75) Inventor: Robert P. Haase, Newport (GB)

(73) Assignee: International Rectifier Corporation, El Segundo, CA (US)

(*) Notice: Subject to any disclaimer, the term of this patent is extended or adjusted under 35 U.S.C. 154(b) by 66 days.

(21) Appl. No.: 10/786,871

(22) Filed: Feb. 24, 2004

(65) Prior Publication Data

US 2004/0253789 A1 Dec. 16, 2004

Related U.S. Application Data

(60) Provisional application No. 60/449,440, filed on Jun. 16, 2003, provisional application No. 60/478,003, filed on Jun. 11, 2003.

(51) Int. Cl.$^7$ ............................................. H01L 21/336
(52) U.S. Cl. ................. 438/270; 257/327; 257/330; 438/514; 438/519; 438/527; 438/542
(58) Field of Search ............................ 257/327, 330, 257/341; 438/270, 302, 514, 519, 527, 542, 438/548

(56) References Cited

U.S. PATENT DOCUMENTS 6,312,993 B1 * 11/2001 Hshieh et al. .............. 438/270

* cited by examiner

Primary Examiner—Asok Kumar Sarkar
(74) Attorney, Agent, or Firm—Ostrolenk, Faber, Gerb & Soffen, LLP

(57) ABSTRACT

A process for fabricating power semiconductor devices involving preparation of a silicon wafer by epitaxial formation of an intrinsic silicon layer on a silicon substrate and high energy implantation to form channel and drift regions in the intrinsic epitaxial silicon.

24 Claims, 3 Drawing Sheets

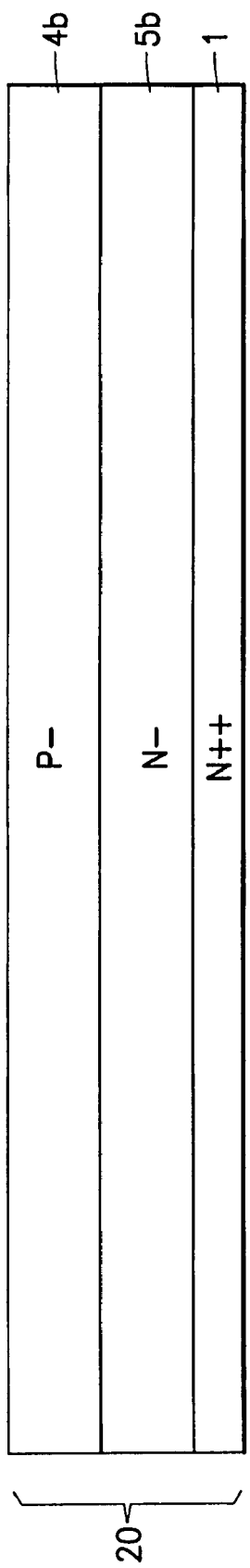
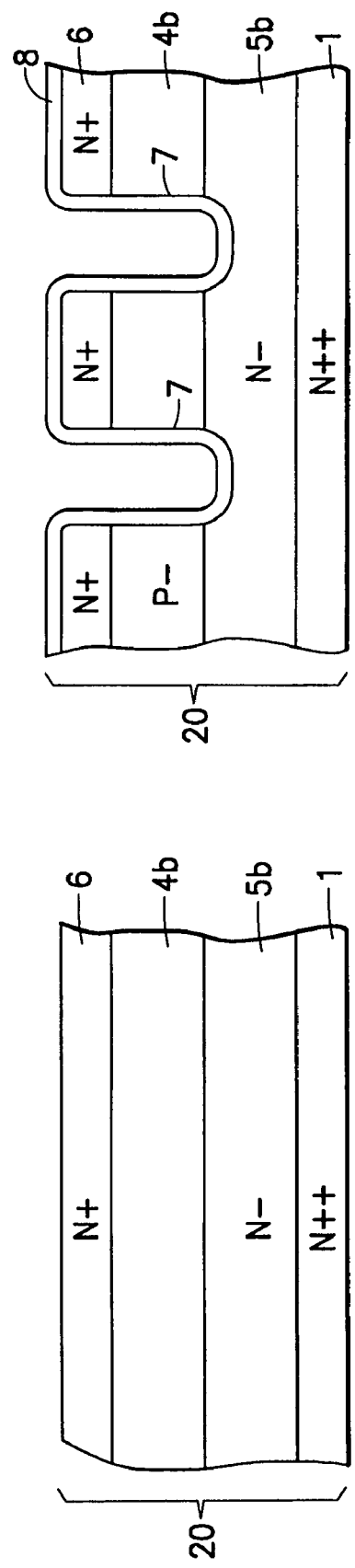

PROCESS FOR FORMING A TRENCH POWER MOS DEVICE SUITABLE FOR LARGE DIAMETER WAFERS

RELATED APPLICATIONS

This application is based on and claims the benefit of U.S. Provisional Application Ser. No. 60/449,440, filed Feb. 24, 2003, entitled A Process for Forming a Trench Power MOS Device Suitable for Large diameter Wafers and U.S. Provisional Application Ser. No. 60/478,003, filed Jun. 11, 2003, entitled A process for Forming a Power MOS Device Suitable for Large Diameter Wafers, to which a claim of priority is hereby made.

FIELD OF THE INVENTION

The invention relates to a method for fabricating semiconductor devices.

BACKGROUND OF THE INVENTION

The ability to fabricate semiconductor devices with sub-micron features has led to the reduction of the size of a die (a discrete unit that constitutes a semiconductor device) that can be manufactured. As a result, a greater number of die can be obtained from a single semiconductor wafer, leading to significant cost reduction.

According to the prior art, identical power semiconductor devices are formed in a semiconductor wafer, and then singulated into individual, discrete die. A conventional wafer for the manufacture of a power semiconductor device includes a silicon substrate of one conductivity, which is cut out of a larger single crystal silicon ingot, and an epitaxially grown silicon layer formed over one surface of the silicon substrate. According to conventional technology, the epitaxial silicon layer is doped with dopants of a selected conductivity (typically the same as the conductivity of the substrate) while the epitaxial silicon layer is being grown. The latter step will be referred to hereafter as in situ doping.

Many types of devices can be formed in a conventional wafer. A power semiconductor switching device which can be formed in a conventional wafer is a trench type power MOSFET. Trench type power MOSFETs are particularly suitable for high voltage and high current applications. A trench type power MOSFET is characterized by trenches that extend through a channel region in the semiconductor die, and support gate structures adjacent to the channel region.

According to a conventional design, the trenches of a trench type semiconductor power device are formed in the epitaxial silicon layer of a die. In a typical device, the epitaxial layer also includes source regions of a first conductivity type, a channel region of a second conductivity type, and an underlying drift region of the first conductivity.

In manufacturing semiconductor devices, it is generally desirable to use larger diameter wafers so that more discrete devices can be simultaneously formed. The use of large diameter wafers can, however, result in difficulties in obtaining critical device parameters. Some of these difficulties are caused by slight deviations in the dopant concentration across the body of the wafer. For example, a slight deviation in substrate temperature during in situ epitaxial growth, or during drive-in or activation of the dopants in the epitaxial layer, can result in deleterious non-uniformity in epitaxial thickness or doping levels. As a result, critical device parameters may become difficult to obtain when a conventional large diameter wafer is used, thereby reducing yield and increasing cost.

BRIEF DESCRIPTION OF THE INVENTION

According to the present invention a semiconductor wafer is prepared by first growing an intrinsic (undoped) silicon body over a semiconductor substrate of a first conductivity, implanting dopants of the first conductivity to a first depth, implanting dopants of a second conductivity to a second depth, the first depth being deeper than the second depth relative to the free surface of the semiconductor body (the surface opposite to the surface in contact with the substrate), and then applying heat to the semiconductor body at a selected temperature and for a selected duration necessary for the dopants of the first conductivity to form a drift region, and for the dopants of the second conductivity to form a channel region. The thickness of the semiconductor body and the applied heat cycle (temperature and duration) may be selected so that the drift region reaches the semiconductor substrate, the channel region meets the drift region, and preferably the channel region reaches the free surface of the semiconductor body.

According to the preferred embodiment silicon is the semiconductor material used.

According to one aspect of the present invention the selected wafer is large; i.e. the diameter of the wafer is more than six inches. Advantageously, large wafers (>6" in diameter) can be fabricated according to the present invention without the drawbacks of the prior art. As a result, a greater number of identical die can be fabricated using a wafer prepared according to the present invention to reduce manufacturing cost.

According to another aspect of the invention, a plurality of identical devices are formed in the semiconductor body after the wafer is fabricated according to the present invention, and then singulated into discrete die.

According to the preferred embodiment the devices produced are trench type MOSFETs.

BRIEF DESCRIPTION OF THE DRAWINGS

The object and other advantages of this invention are best described in the preferred embodiments with reference to the attached drawings.

FIG. 3 illustrates schematically a cross-sectional view of a wafe according to the present invention.

FIGS. 4–8 illustrate schematically selected stages in fabricating semiconductor devices in a wafer according to the present invention.

DETAILED DESCRIPTION OF THE INVENTION

Figure 1:
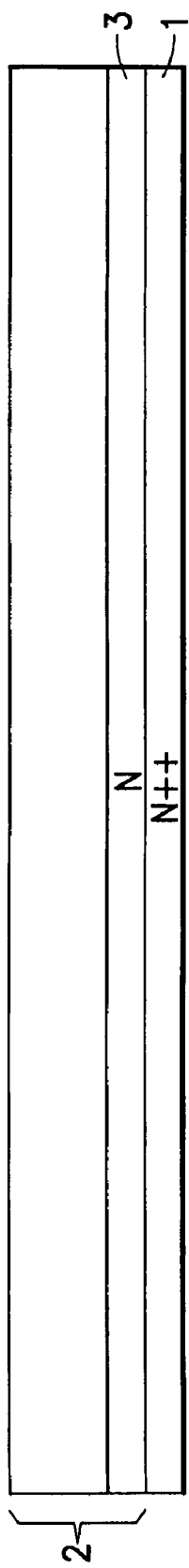
FIGS. 1–2 illustrate schematically selected stages in fabricating a wafer according to the present invention.

Referring to FIG. 1, according to an embodiment of the present invention, an intrinsic (undoped) silicon layer 2 is grown epitaxially on the first major surface of an N+ single crystal silicon substrate 1. Epitaxial silicon layer 2 is grown intrinsically to any desired thickness, for example, two microns, using silane or dichlorosilane as a source. The elevated temperature used for the growth of intrinsic epitaxial silicon layer 2 results in out-diffusion of N type dopants from substrate 1, forming an N type region 3 in a bottom portion of epitaxial silicon layer 2. The dopant level of N type region 3 is less than the dopant level in the body of substrate 1. FIG. 1 illustrates the structure obtained after the growth of epitaxial silicon layer 2.

Figure 2:
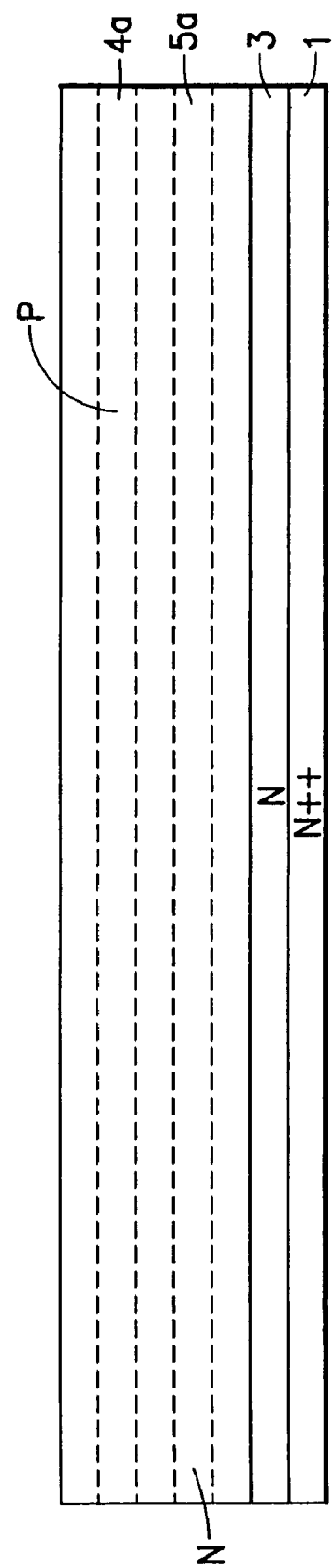

Referring now to FIGS. 2 and 3, a blanket, high energy implantation procedure is first performed using a P type dopant species, such as boron, to form P type region 4a in epitaxial silicon layer 2. Next, another blanket, high energy implantation procedure is performed using an N type dopant species, such as arsenic or phosphorous, to form N type region 5a in epitaxial silicon layer 2 at a depth below that of P type region 4a. The result of the implantations is schematically shown in FIG. 2. In certain circumstances it may be preferable to reverse the sequence of implants 4a and 5a.

Referring next to FIG. 3, the dopants are driven at a suitable temperature between about 800 to 1200° C. for as long as necessary to activate the implanted dopants and diffuse the same until channel region 4b and drift region 5b are formed as shown by FIG. 3. Optionally, a high temperature drive may be performed between implant 4a and 5a, in addition to the high temperature drive of both implants. It should be noted that the thickness of epitaxial silicon layer 2, the depth of P type region 4a and N type region 5a, and the thermal cycle (temperature and duration of the activation and diffusion step) are selected such that channel region 4b and drift region 5b meet, the drift region 5b at least reaches region 3, and preferably channel region 4b reaches the free surface of epitaxial silicon layer 2. The free structure referred to herein is the surface opposite the surface that is in contact with substrate 1.

The combination of intrinsic epitaxial silicon and blanket, high energy implantation results in improved uniformity of dopant distribution in region 4b and drift region 5b, when compared to the same regions formed in an epitaxial silicon layer according to prior art. As a result, wafer 20 is obtained, which ready to be processed further to produce semiconductor devices.

According to an aspect of the present invention, the technique described above can be used to prepare wafers larger than six inches with improved dopant distribution in drift region 5b, and also channel region 4b. As explained above, larger wafers reduce manufacturing cost. Thus, a technique according to the present invention allows for a large wafer (more than six inches in diameter) to be used to produce a greater number of die without the drawbacks of the prior art.

Once wafer 20 is prepared according to the present invention, a plurality of power semiconductor devices may be formed in the wafer.

Beginning with FIG. 4, the fabrication of a power MOSFET of the trench variety according to the preferred embodiment of the present invention, formed in a wafer prepared according to the present invention, will now be explained. For convenience, the formation of a few active cells of only one device will be explained. One skilled in the art will recognize that, although not shown specifically, the technique illustrated herein is applicable to fabricate a plurality of identical devices in a wafer prepared according to the present invention.

Referring now to FIG. 4, a source implant region is preferably formed by implantation of N type dopants such as arsenic or phosphorous ions using a conventional source mask (not shown). An anneal procedure is then performed in, for example, a furnace or in a rapid thermal anneal to activate the arsenic or phosphorous ions in order to form source region 6. The depth of source region 6 corresponds to the desired dimension for the channel region 4b. The mask used for the definition of source region 6 is removed by, for example, plasma oxygen ashing or the like. Optionally, an insulation layer may be formed over the epitaxial silicon prior to forming trenches.

Figure 6:
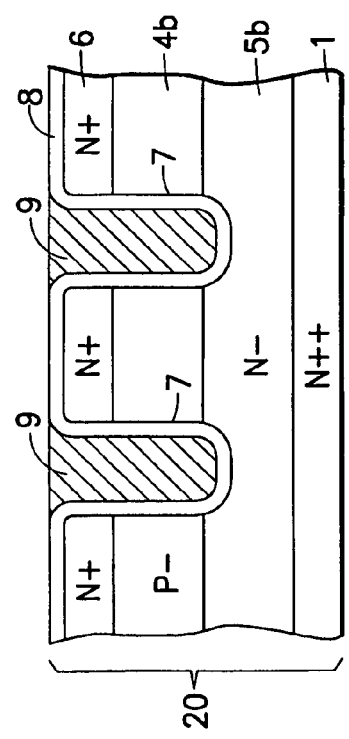

Referring next to FIG. 6, a trench mask is applied in order to define regions in epitaxial silicon that are to be removed to form trenches 7. Using an appropriate etching method, for example, anisotropic etching, trenches 7 are formed through source region 6, and channel region 4b, and reach at least drift region 5b. Trenches 7 can have any desired depth, width and spacing and may be formed using $Cl_2$ or $SF_6$ as an etchant for silicon. Optionally, an insulation layer may be formed over epitaxial silicon layer 2 prior to forming trenches 7. If the insulator layer option is used, the reactive ion etching procedure is initiated using $CHF_3$ as the etchant for the insulator layer. After trenches 7 are formed, the trench mask is removed by, for example, plasma oxygen ashing procedure. To remove the damage caused by reactive ion etching from the surface of trenches 7, a sacrificial silicon oxide layer is thermally grown, then immediately removed with a buffered hydrofluoric acid. The removal of the damage prepares the surfaces of trenches 7 for gate oxidation. If the insulator layer option is used as a screen oxide layer for definition of source regions 6, it is removed during the wet etch removal of the sacrificial silicon oxide layer.

Thereafter, gate oxide 8, comprised of silicon dioxide, is thermally grown in an oxygen environment to a thickness of between 300 to 1200 Å. The gate oxidation also results in the formation of a silicon dioxide layer on the top surface of epitaxial silicon as shown schematically in FIG. 5.

Referring next to FIG. 6, an in situ doped polysilicon layer is deposited using low pressure chemical vapor deposition (LPCVD) to completely fill trenches 7. The in situ polysilicon layer is obtained using silane as a source, with the addition of arsine or phosphine to form an N type in situ doped polysilicon layer. Next, polysilicon is removed from the top portion of oxide 8 on the top surface of epitaxial silicon layer using chemical mechanical polishing (CMP). As a result of the CMP, gate electrodes 9 are formed in trenches 7 as shown in FIG. 6. It should be noted that in a preferred embodiment of the present invention, CMP is terminated once oxide layer 8 is reached. Alternatively, the unwanted portions of polysilicon can be selectively removed from the top surface of oxide layer 8 with a reactive ion etching using $Cl_2$ or $SF_6$ as an etchant.

Figure 7:
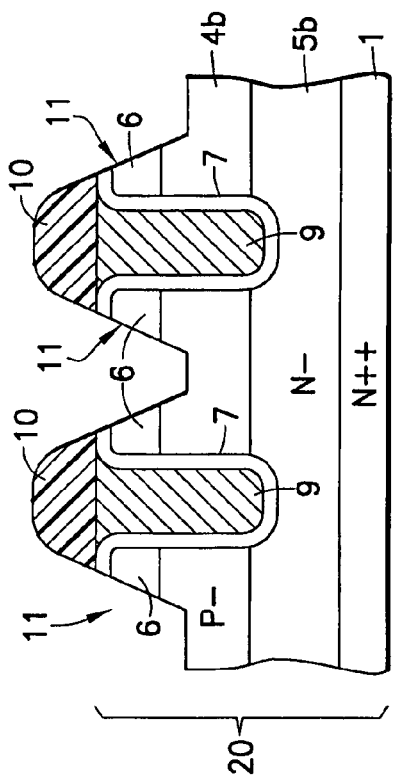

Referring next to FIG. 7, silicon dioxide layer 10, is next deposited using LPCVD or plasma enhanced chemical vapor deposition (PECVD) using tetraethylorthosilicate (TEOS) as a source. A source contact mask is then used to define contact holes 11 through silicon dioxide layer 10, silicon dioxide layer 8, source region 6, and into a top portion of channel region 4b. Preferably, reactive ion etching is performed using $CHF_3$ as an etchant for the insulator layers, while $Cl_2$ or $SF_6$ is used as an etchant for the silicon regions. Contact holes 11, can be formed with a tapered shape, as schematically shown in FIG. 7, or formed using anisotropic reactive ion etching resulting in vertically oriented sidewalls for the contact holes 11. The photoresist shape used for definition of contact holes 11 is removed by plasma oxygen ashing.

Figure 8:
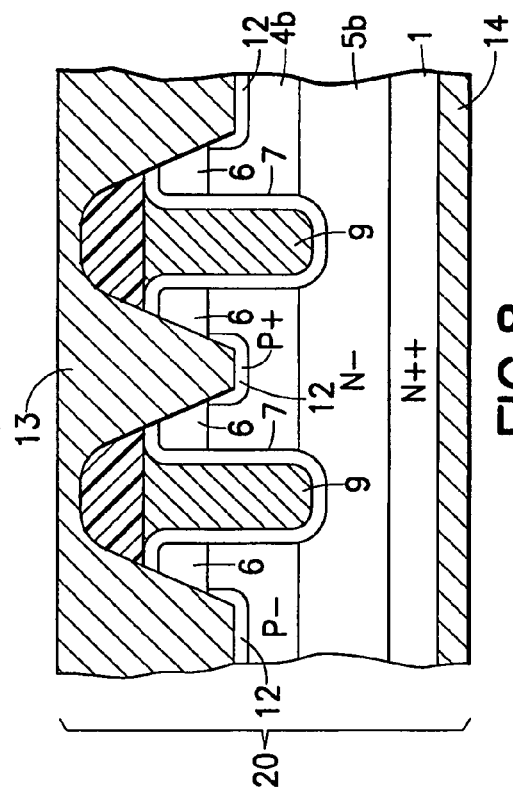

Referring next to FIG. 8, low resistivity contact regions 12 are next formed in the portion of channel region 4b exposed at the bottom of contact holes 11 through implantation of boron or $BF_2$ ions. The implants in low resistivity contact regions 12 are then annealed and source contact 13 is formed. Low resistivity contact regions 12 are provided to reduce the resistance between source contact 13 and the channel region. Typically, source contact 13 is formed of a metal chosen from a group that contains aluminum, aluminum-copper, aluminum-silicon, titanium nitride, tungsten or in some cases, tungsten silicide or titanium silicide. Deposition of the source contact 13 is accomplished by PVD or LPCVD, or by electroplating if copper is used. Photolithographic and reactive ion etching procedures are then employed to define the final shape of source contact 13. Reactive ion etching can be performed using $Cl_2$ or $SF_6$ as an etchant for the metal layer. The photoresist shape used to define source contact structures 13 is again removed using plasma oxygen ashing. Last, a blanket metal layer 14 is deposited on the backside of substrate 1, to serve as a drain contact to the device.

The embodiment described herein results in an N-channel device. A person skilled in the art would recognize that by reversing polarities a P channel device may be obtained without deviating from the present invention.

Once a plurality of identical devices are formed in a wafer 20 (see FIG. 3) according to the present invention, the identical devices are singulated out of wafer 20 as discrete die, each including a semiconductor device.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for fabricating a semiconductor device, comprising:
    providing a semiconductor substrate of a first conductivity;
    epitaxially growing an undoped intrinsic semiconductor body over a major surface of said semiconductor substrate;
    implanting dopants of a second conductivity into said intrinsic semiconductor body to a first depth;
    implanting dopants of said first conductivity into said intrinsic semiconductor body to a second depth, said second depth being farther from a free surface of said semiconductor body than said first depth and closer to said substrate than said first depth; and
    applying heat to said semiconductor body to at least activate said dopants of said first conductivity and said dopants of said second conductivity and to diffuse said dopants until said dopants of said first conductivity and said dopants of said second conductivity meet inside said semiconductor body; whereby a channel region is formed over a drift region in said semiconductor body.

2. A process according to claim 1, further comprising forming a gate structure adjacent said channel region, said gate structure comprising a gate insulation layer adjacent said channel region, and a gate electrode adjacent said gate insulation layer.

3. A process according to claim 2, wherein said gate insulation layer is comprised of silicon dioxide and said gate electrode is comprised of polysilicon.

4. A process according to claim 2, further comprising forming a trench in said semiconductor body extending through said channel region into said drift region, and disposing said gate structure in said trench.

5. A process according to claim 4, further comprising forming a conductive region of said first conductivity adjacent said gate structure in said semiconductor body, said conductive region extending to a third depth, said third depth being closer to said free surface of said semiconductor body than said first depth.

6. A process according to claim 5, wherein said conductive region is a source region and said semiconductor substrate serves as the drain region.

7. A process according to claim 6, further comprising creating a recess in said semiconductor body, said recess extending to a depth below that of said source region and exposing said channel region, and further comprising forming a source contact over said free surface of said semiconductor body in electrical contact with said source region and said channel region.

8. A process according to claim 7, wherein said recess includes tapered sidewalls.

9. A process according to claim 7, wherein said recess includes vertical sidewalls.

10. A process according to claim 7, further comprising implanting dopants of said second conductivity at the bottom of said recess prior to forming said source contact.

11. A process for fabricating a semiconductor die, comprising:
    providing a semiconductor wafer of first conductivity;
    epitaxially growing an undoped intrinsic semiconductor body over one major surface of said semiconductor wafer, said semiconductor body having a free surface opposite said semiconductor wafer;
    forming a region of second conductivity in said semiconductor body at a first depth below said one major surface;
    forming a region of said first conductivity in said semiconductor body at a second depth below said first depth;
    applying heat to said semiconductor body to activate said dopants of said first and second conductivity, and to diffuse said dopants until said region of said second conductivity reaches said region of said first conductivity, whereby a channel region is formed from said region of said second conductivity and a drift region is formed from said region of said first conductivity;
    forming a plurality of identical devices in said semiconductor body, each one of said identical devices constituting a die; and
    singulating each die.

12. A process according to claim 11, further comprising forming a gate structure adjacent said channel region in each said die, said gate structure comprising a gate insulation layer adjacent said channel region, and a gate electrode adjacent said gate insulation layer.

13. A process according to claim 12, wherein said gate insulation layer is comprised of silicon dioxide and said gate electrode is comprised of polysilicon.

14. A process according to claim 12, further comprising forming a trench in said semiconductor body extending through said channel region into said drift region, and disposing said gate structure in said trench in each said die.

15. A process according to claim 14, further comprising forming a conductive region of said first conductivity adjacent said gate structure in said semiconductor body in each said die, said conductive region.

16. A process according to claim 15, wherein said conductive region is a source region.

17. A process according to claim 16, further comprising creating a recess in said semiconductor body, said recess extending to a depth below that of said source region and exposing said channel region, and further comprising forming a source contact over said free surface of said semiconductor body in electrical contact with said source region and said channel region in each said die.

18. A process according to claim 17, wherein said recess includes tapered sidewalls.

19. A process according to claim 17, wherein said recess includes vertical sidewalls.

20. A process according to claim 17, further comprising implanting dopants of said second conductivity at the bottom of said recess prior to forming said source contact in each said die.

21. A process for fabricating a semiconductor wafer, comprising:
   providing a semiconductor substrate of first conductivity;
   epitaxially forming an undoped intrinsic semiconductor body over a first major surface of said substrate;
   implanting dopants of second conductivity into said semiconductor body to a depth below a free surface of said semiconductor body;
   implanting dopants of said first conductivity into said semiconductor body to a depth below said depth of said dopants of said second conductivity; and
   applying heat to said semiconductor body for a period of time at a selected temperature to activate said dopants and to diffuse the same until at least said dopants of said first conductivity reach said dopants of said second conductivity,
   whereby said dopants of said first conductivity form a drift region coextensive with a channel region along the lateral direction in said semiconductor body.

22. A process according to claim 21, wherein said substrate has a diameter that is larger than six inches.

23. A process according to claim 21, wherein the thickness of said epitaxial body, said depth of said dopants of said first conductivity, said depth of said dopants of said second conductivity, said period of time and said temperature are selected so that said drift region reaches at least said semiconductor substrate.

24. A process according to claim 21, wherein the thickness of said epitaxial body, said depth of said dopants of said first conductivity, said depth of said dopants of said second conductivity, said period of time and said temperature are selected so that said channel region reaches said free surface of said semiconductor body.

* * * * *